(12) United States Patent
Callicotte et al.

(10) Patent No.: US 8,296,347 B2
(45) Date of Patent: Oct. 23, 2012

(54) USE OF LINE CHARACTERIZATION TO CONFIGURE PHYSICAL LAYERED DEVICES

(75) Inventors: Mark Joseph Callicotte, Sacramento, CA (US); Hiroshi Takatori, Sacramento, CA (US)

(73) Assignee: Vintomie Networks B.V., LLC, Dover, DE (US)

( * ) Notice: Subject to any disclaimer, the term of this patent is extended or adjusted under 35 U.S.C. 154(b) by 1268 days.

(21) Appl. No.: 11/981,565

(22) Filed: Oct. 30, 2007

(65) Prior Publication Data

US 2008/0275929 A1    Nov. 6, 2008

Related U.S. Application Data

(60) Provisional application No. 60/900,180, filed on Feb. 7, 2007.

(51) Int. Cl.
*G06F 17/10*    (2006.01)
(52) U.S. Cl. ...................................... 708/319
(58) Field of Classification Search .................. 708/319
See application file for complete search history.

(56) References Cited

U.S. PATENT DOCUMENTS

| | | | |
|---|---|---|---|
| 5,050,119 A * | 9/1991 | Lish | 708/319 |
| 5,181,198 A | 1/1993 | Lechleider | |
| 5,483,551 A | 1/1996 | Huang et al. | |
| 5,623,377 A * | 4/1997 | Behrens et al. | 360/65 |
| 6,201,796 B1 | 3/2001 | Agazzi | |
| 6,212,225 B1 | 4/2001 | Agazzi | |
| 6,236,645 B1 | 5/2001 | Agazzi | |
| 6,272,173 B1 | 8/2001 | Hatamian | |
| 6,304,598 B1 | 10/2001 | Agazzi | |
| 6,463,041 B1 | 10/2002 | Agazzi | |
| 6,792,038 B2 | 9/2004 | Agazzi | |
| 6,934,387 B1 | 8/2005 | Kim | |
| 7,570,685 B2 | 8/2009 | Takatori | |
| 7,827,224 B1 * | 11/2010 | Lam | 708/319 |
| 2001/0004383 A1 | 6/2001 | Nordstrom et al. | |
| 2001/0019581 A1 | 9/2001 | Agazzi | |
| 2001/0036160 A1 | 11/2001 | Curran et al. | |
| 2001/0055335 A1 | 12/2001 | Agazzi | |
| 2002/0141495 A1 | 10/2002 | Hatamian | |

(Continued)

OTHER PUBLICATIONS

Bichan, Mike, "Echo Cancellation in Crosstalk-Limited Chip-to-Chip Communication", slides dated Nov. 2003 [retrieved from the internet on Sep. 23, 2004 URL:http://www.eecg.toronto.edu/!mbichan_ece1392.pdf>> Nov. 2003, 1-5.

(Continued)

*Primary Examiner* — Tan V. Mai
(74) *Attorney, Agent, or Firm* — Dorsey & Whitney LLP

(57) ABSTRACT

A method of optimizing filter performance through monitoring channel characteristics is provided. A signal enters a channel and a receiver receives the signal. The receiver includes a FIR filter to remove near-end transmitted interference and recover a far-end desired signal. The filter has storage elements configured as a shift registers to move the signal, multipliers to multiply the signal by a filter coefficient, an intermittent summer to combine the multiplied results into a replica of an interfering signal, a final summer to remove the replica from the receiver signal to provide direct and indirect monitoring of the signal, where direct monitoring includes time or frequency monitoring, and indirect monitoring includes monitoring signal to noise ratio, error magnitude or bit error rate. The filter is optimized according to monitoring and includes reducing a dynamic range, reducing bits of precision, reducing linearity, the filter, and reallocating the filter.

10 Claims, 3 Drawing Sheets

U.S. PATENT DOCUMENTS

| | | |
|---|---|---|
| 2002/0196747 A1 | 12/2002 | Agazzi |
| 2003/0053531 A1 | 3/2003 | Agazzi |
| 2004/0090927 A1 | 5/2004 | Zimmerman et al. |
| 2004/0170230 A1 | 9/2004 | Zimmerman et al. |
| 2004/0184518 A1 | 9/2004 | Agazzi |
| 2005/0144534 A1* | 6/2005 | Hutchins et al. ............... 714/45 |

OTHER PUBLICATIONS

Cook, J. W. et al., "The Noise and Crosstalk Environment for ADSL and VDSL Systems", *IEEE Communications* May 1999, 73-78.

Egier, Aaron, "Overcoming Crosstalk in DSL Systems, draft dated Nov. 19, 2002", [Retrieved from the internet on Sep. 23, 2004, <<URL:http://www.eecg.toronto.edu/~tcc/ece1392/egier.pdf>>], 1-9.

Ginis, G. et al., "Vectored-DMT: A FEXT canceling modulation scheme for coordinating users", *ICC 2001*, Helsinki, Finland, accepted for presentation. [Retrived from the internet on Sep. 24, 2004 <<URL:http://citeseer.ist.psu.edu/ginis01vectoreddmt.html>>], 1-5.

Uzcategui, Roberto A., "Crosstalk Mitigation in DSL Systems", *Research Interests* [Retrieved from the Internet on Sep. 23, 2004 <<URL:http://users.ece.gatech.edu/~roberto/research/>>, 1-2.

\* cited by examiner

USE OF LINE CHARACTERIZATION TO CONFIGURE PHYSICAL LAYERED DEVICES

CROSS-REFERENCE TO RELATED APPLICATIONS

This application is cross-referenced to and claims the benefit from U.S. Provisional Patent Application 60/900,180 filed Feb. 7, 2007, which is hereby incorporated by reference.

FIELD OF THE INVENTION

The invention relates generally to networking. More particularly, the invention relates to a method of optimizing filter performance through monitoring channel characteristics in a network.

BACKGROUND

Recent telecommunications technology has improved communication efficacy. Advanced methods of communications require creative solutions to problems encountered in implementing such advancements. Finite impulse response (FIR) filters are commonly used in high-speed data communications electronics for cancellation of interfering signals, such as echo, near-end crosstalk (NEXT) and far-end crosstalk (FEXT). Below is described a system for canceling echo.

A FIR filter is typically implemented by using a series of delays, multipliers, and adders to create the filter's output. The process of selecting the filter's length and coefficients is in the filter design, where the design effort should result in a frequency response which meets the desired specifications, including ripple and transition bandwidth, and optimize the filter's length and coefficients. The longer the filter (more taps), the more finely the response can be tuned, however the longer the filter, the more resources (power, circuitry, noise margin) are required to meet the performance requirements.

Currently, common data transceiver design includes an echo canceller that removes the undesired echo signal by creating a replica of the echo signal and subtracting it from the far-end generated signal. This method makes use of the fact that the echo signal is a linear function of a near-end transmitted signal, i.e. a given system with a given transmit signal produces a predictable echo signal. Therefore, a mathematical model of the echo signal based on the near-end data signal can be accurately built inside the echo canceller. However, often times the filter must include numerous taps to accommodate multiple operational circumstances, resulting in a lengthy filter that is over-designed, underutilized and burdensome to the system.

The near-end data signal is transmitted through an Adaptive Linear Filter, which produces an echo estimate. This echo estimate is then subtracted from the incoming signal, which is the sum of the desired far-end signal and the interfering echo signal, leaving the desired signal and any un-canceled echo. This data is recovered from this resulting signal. The difference between the resulting signal and the recovered data is used as the measurement of the error between the current and desired result, and can be used to adapt the filter's coefficients. This process is repeated until the error signal is minimized, and the echo estimate matches the echo as close as possible.

By examining the coefficient results of the Adaptive Linear Filter, it is possible to reconfigure the filter so that it is sufficient to cancel the interfering signal, but not to require the filter to have excessive dynamic range, unneeded bits of precision, excessive linearity or unneeded filter taps.

Accordingly, there is a need to develop a method of examining the coefficient results of the Adaptive Linear Filter to reconfigure the filter so that it is sufficient to cancel the interfering signal, but not to require the filter to have excessive dynamic range, unneeded bits of precision, excessive linearity or unneeded filter taps.

SUMMARY OF THE INVENTION

The current invention is a method of optimizing filter performance through monitoring channel characteristics. In one embodiment of the invention, the method includes providing a signal into a channel and providing a receiver to receive the signal. The receiver includes a finite impulse response (FIR) filter disposed to remove a transmitted interfering signal from the signal in the channel and to recover a far end desired signal. The FIR filter includes a plurality of storage elements configured as a shift register to move the signal, multipliers to multiply the signal by a filter coefficient and provide a multiplied result, an intermittent summer to combine the multiplied results into a replica of an interfering signal, a final summer to remove the replica from the receiver signal, providing direct monitoring of the signal. The direct monitoring includes time monitoring or frequency monitoring and providing indirect monitoring of the signal. The indirect monitoring includes signal to noise ratio (SNR) monitoring, error magnitude monitoring or bit error rate (BER) monitoring. The current embodiment further includes optimizing the filter according to the monitoring. The optimization is selected from a group consisting of reducing a dynamic range in the filter, reducing bits of precision in the filter, reducing linearity of the filter, disabling the filter, and reallocating filter.

In one aspect of the invention, the FIR filter is an echo-canceling filter.

In another aspect of the invention, the FIR filter is a near-end crosstalk canceling filter.

In a further aspect of the invention, the FIR filter is a far-end crosstalk canceling filter.

According to another aspect of the invention, the storage element is a RAM cell.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

By monitoring the characteristics of the channel, filters may be optimized to improve performance. The monitoring may be direct, in the form of time of frequency domain parameters, or indirect, by measuring the signal-to-noise ratio (SNR) of bit error rate (BER). Optimization of the filter may include reducing their required dynamic range, bits of precision, linearity or disabling them altogether. Further, limited filter resources may be reallocated to where they would be most useful, such as delaying finite impulse response (FIR) filter taps.

Figure 1:
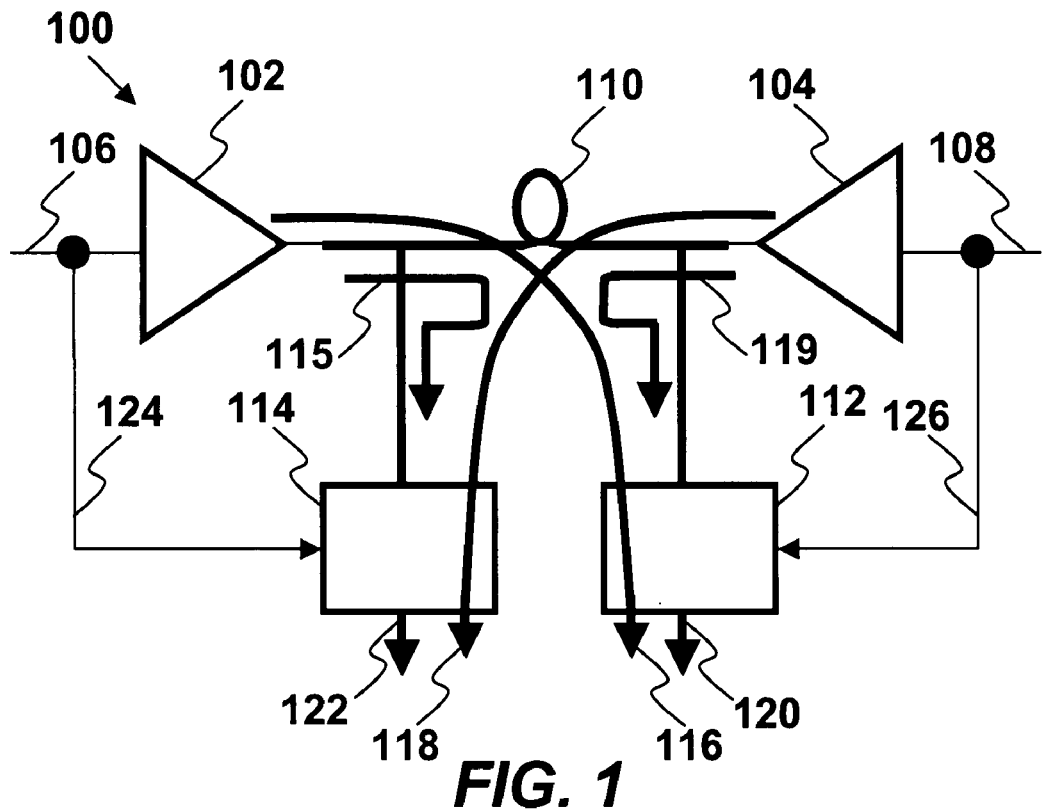
FIG. 1 shows a full-duplex communication system according to the present invention.

Referring to the figures, FIG. 1 shows a diagram of the preferred embodiment having a full-duplex communication system 100. The system 100 includes transmitter TX1 102 and transmitter TX2 104, which sends data TX Data1 106 and TX Data2 108 onto the channel 110. The receiver consists of echo canceling FIR filters (112/114), which removes echo signals (115/119) from the transmitted signals (116/118) and recovers the far end data (120/122). Data lines (124/126) are disposed to provide data (106/108) to the filters (112/114).

Figure 2:
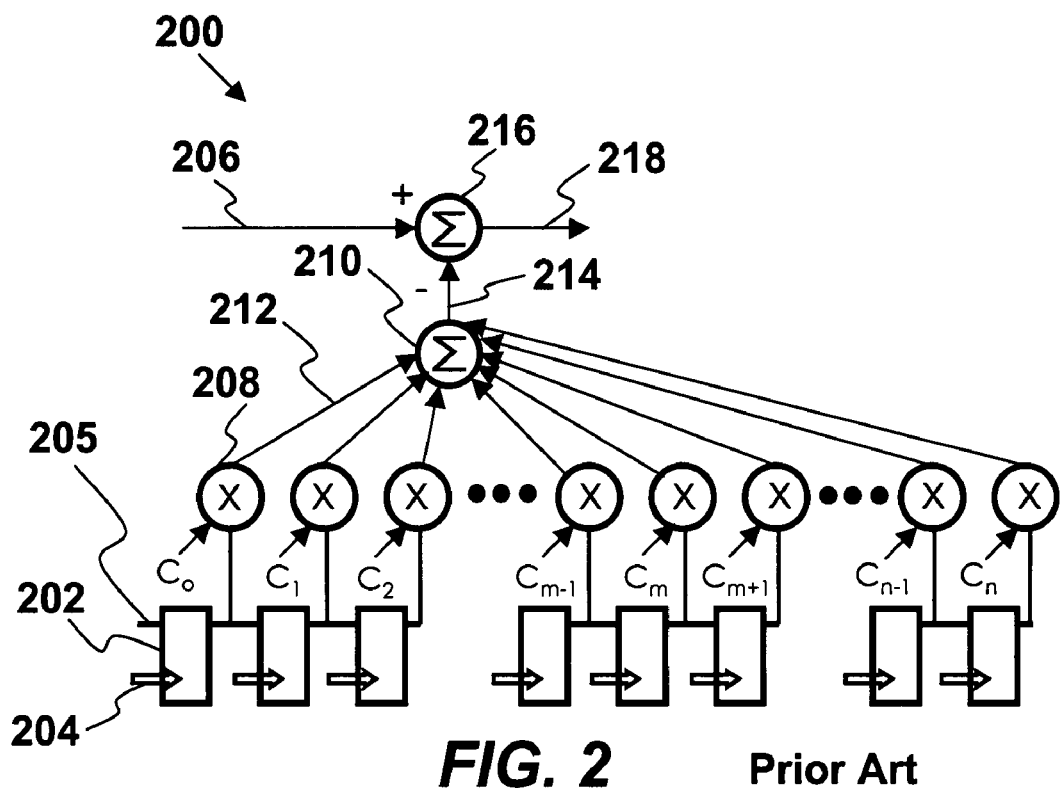
FIG. 2 shows a block diagram of an echo canceling FIR filter according to the present invention.

FIG. 2 shows a block diagram of a prior art Echo Canceling FIR filter 200. The filter 200 includes Flip-Flops 202 configured as a shift register 204 to move the interfering data 205, multipliers 208 to multiply the data 205 by a filter coefficient ($C_i$), a first summer 210 to combine the various multiply results 212 into a replica of the interfering signal 214 and a final summer 216 to remove the replica 214 from the received signal 206 and provide a desired output signal 218. For an echo or NEXT canceller, the interfering data 205 is the transmitted data and for a FEXT canceller, the interfering data 205 is the received data. The received signal 206 consists of the desired signal as well as the interfering signal 205 that results from the system response.

Figure 3:
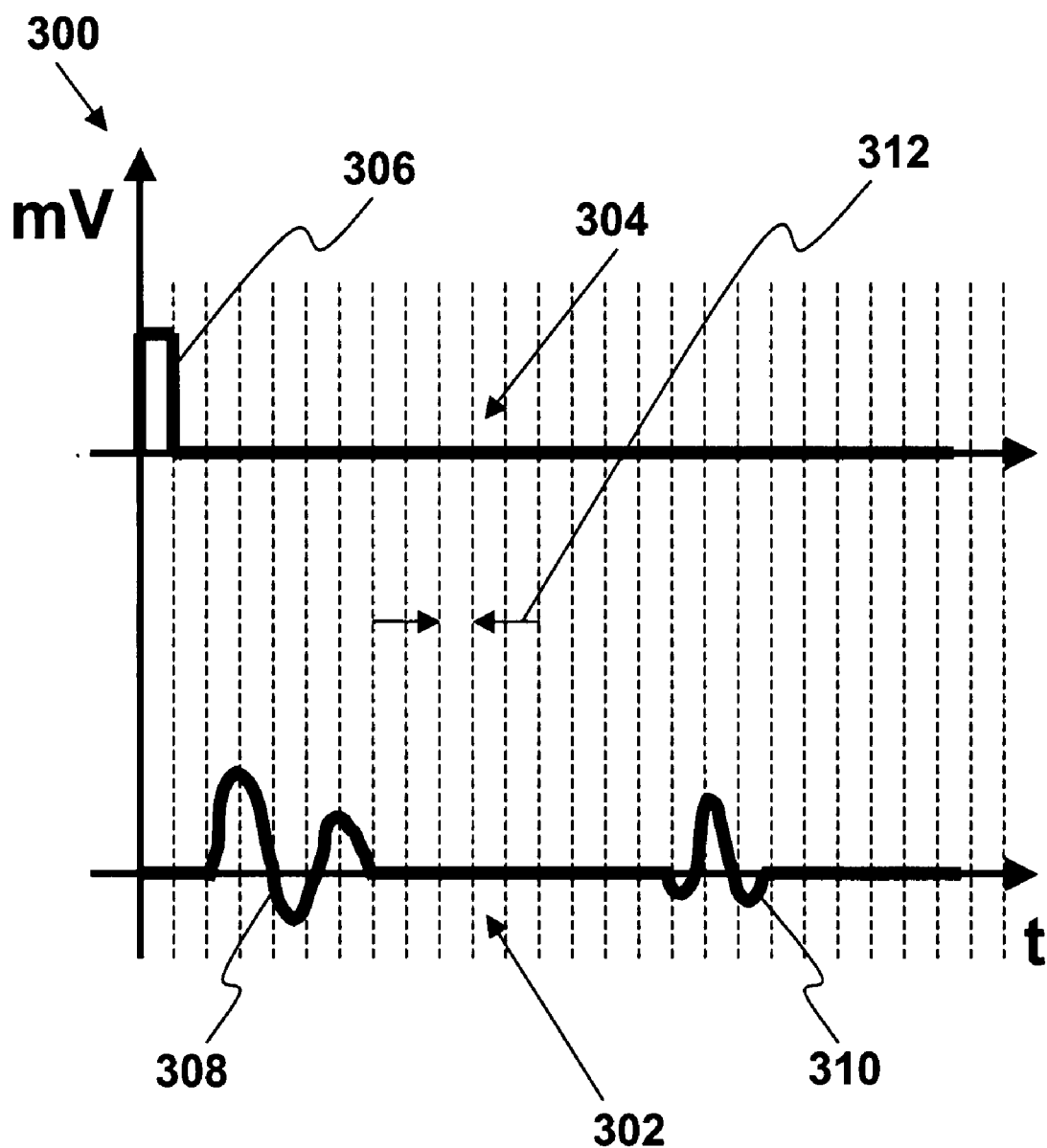
FIG. 3 shows a plot of the impulse response at the receiver due to a pulse from a transmitter according to the present invention.

In many systems, the echo results from imperfections at the transmitter. FIG. 3 shows a plot 300 of the receiver impulse response 302 due to a transmitter pulse signal 304. Here, the transmitted pulse 306 creates near-end reflected signals 308, which may be small for some time as the signal propagates, then a far-end reflected signal 310 is created. This far-end reflection 310 is a function of the length of the channel as defined by a number of baud periods 312, thus the echo canceller needs to have FIR filter taps sufficient to filter up to the maximum length of the channel.

Figure 4:
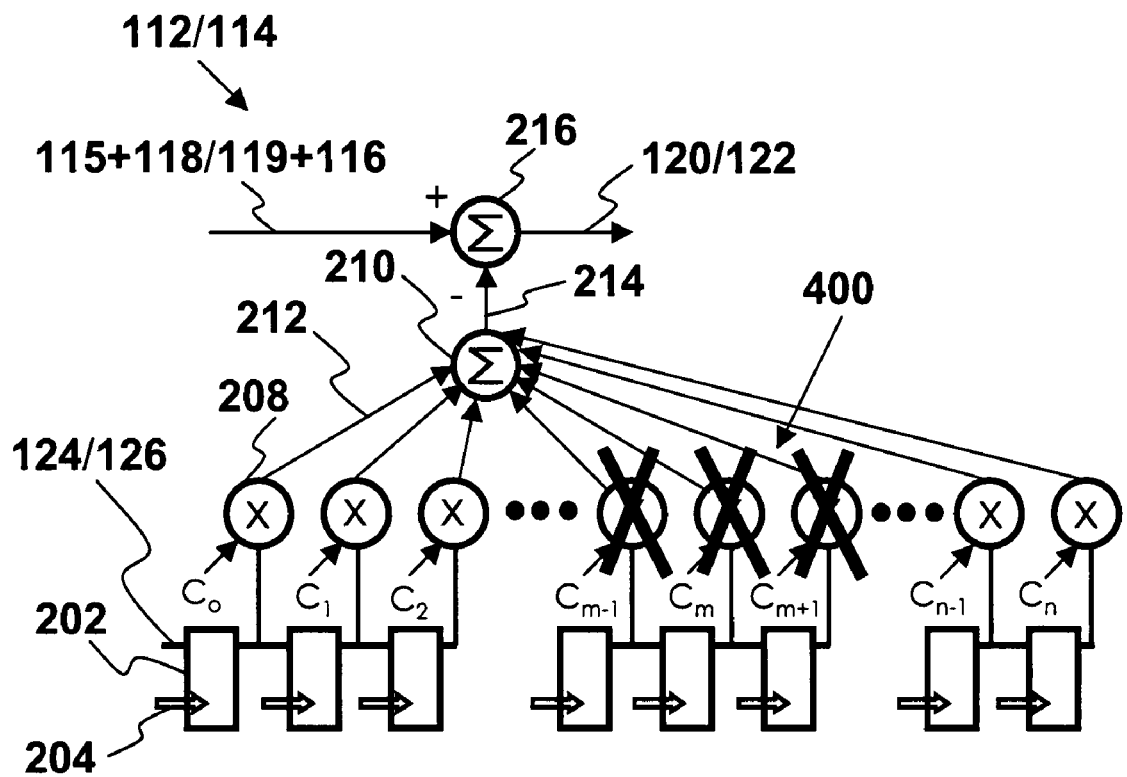
FIG. 4 shows a modified FIR filter with unnecessary taps removed according to the present invention.

According to the preferred embodiment of the invention, as shown in FIG. 4, details of the channel response are used to reconfigure the filter (112/114) so that it is sufficient to cancel the echo to the desired level but not to include any more taps than necessary. By examining the echo response in FIG. 3, it is evident that the FIR filter taps between the near-end and far-end reflection 400 are not needed, so the FIR Filter (112/114) can be modified to remove unnecessary taps 400.

Because the flip-flops 202 remain in an on state, data (124/126) is required to be passed, however, the multipliers 204 and coefficient generators (not shown) can be removed. Some advantages here are in power savings and improved performance since each FIR tap will introduce noise into the replicated signal 214, which will eventually end up degrading the desired signal 120/122.

Some methods that are useful in determining which portions of the filter may be disabled include examining the time domain response of the signal. The time domain response examination can be done by using the FIR taps in an adaptive loop, then examine the resulting coefficient values. The coefficient values below a particular threshold can indicate the FIR taps that are not needed. Another method can include selectively disabling taps and measuring the resulting noise on the desired signal. The taps having an impact on the noise level should be left in an on state, and the taps without a measurable impact can be left off. Accordingly, taps may be selected in groups or individually, depending on design constraints.

Figure 5:
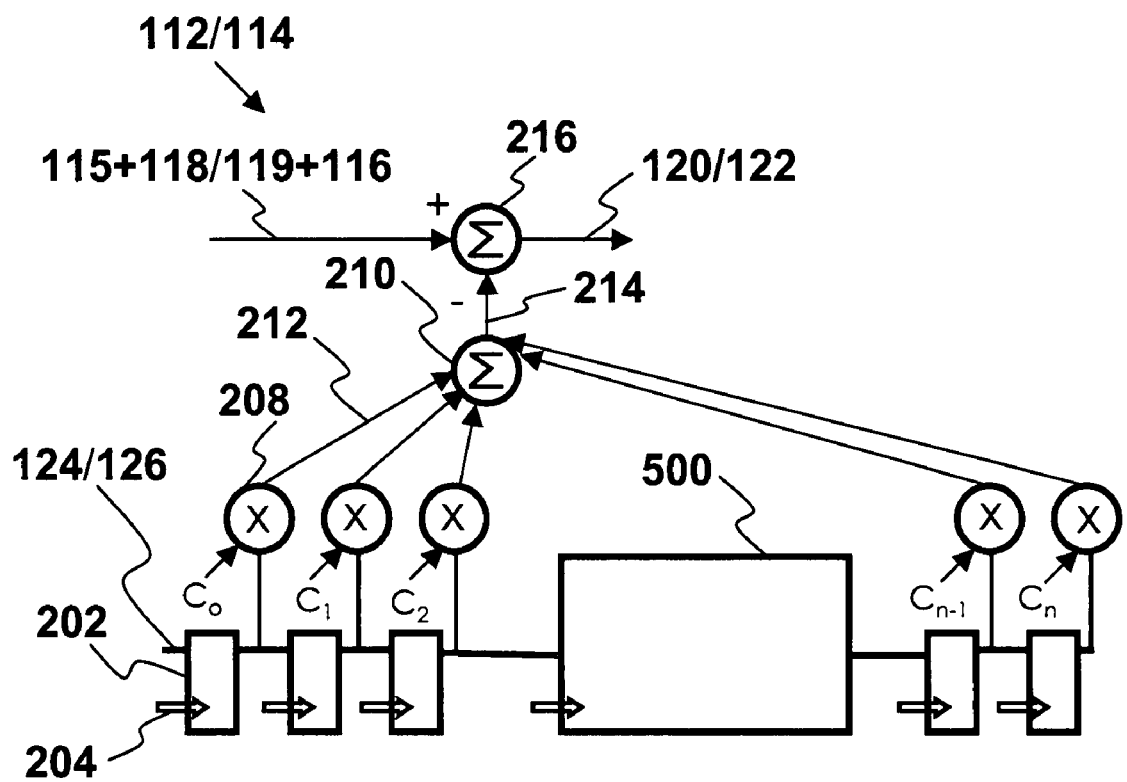
FIG. 5 shows a FIR filter with a programmable delay replacing middle filter taps according to the present invention.

FIG. 5 shows an alternate embodiment of the invention, where shown is a block diagram of a FIR filter (112/114) built with a programmable delay 500. Here, rather than disabling unused filter taps, if it is determined when the channel coefficients are measured, that the channel is not a significant source of reflections, the FIR filter (112/114) can be built without the middle filter taps 400 but rather with a programmable delay 500. Further, other forms of interference may be cancelled in this manner. Some of those include inter-symbol interference (ISI), near-end crosstalk (NEXT) and far-end crosstalk (FEXT).

In another embodiment of the invention, the filter does not need to reside in the receiver. A filter can exist in the transmitter (not shown), combining the replica signal with the transmit signal such that the interference created is cancelled when the signal gets to the far-end.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A method of modifying a finite impulse response filter, the method comprising:
    receiving a signal through a communications channel;
    filtering the signal using the finite impulse response filter to at least partially remove an interfering signal;
    monitoring a characteristic of the communications channel; and
    optimizing the finite impulse response filter based, at least in part, on the characteristic of the communications channel;
    wherein the finite impulse response filter comprises taps, wherein individual ones of the taps are associated with respective coefficients; and
    wherein said optimizing the finite impulse response filter includes:
        selectively disabling selected ones of the taps;
        measuring noise output from the finite impulse response filter; and
        disabling individual taps of the selected ones of the taps having no measurable impact on the noise output from the finite impulse response filter.

2. The method of claim 1, wherein the characteristic comprises a time domain response to the signal.

3. The method of claim 1, wherein said monitoring the characteristic comprises measuring a signal-to-noise ratio of the received signal.

4. The method of claim 1, wherein said monitoring the characteristic comprises measuring a bit error rate.

5. The method of claim 1, wherein the finite impulse response filter is configured to at least partially remove an echo signal from the received signal.

6. The method of claim 1, wherein the finite impulse response filter is configured to at least partially remove crosstalk from the received signal.

7. The method of claim 1, wherein said selectively disabling comprises disabling a group of the taps.

8. The method of claim 1, wherein said selectively disabling comprises disabling the selected ones of the taps individually.

9. The method of claim 1, wherein the interfering signal comprises inter-symbol interference.

10. The method of claim 1, wherein the interfering signal comprises near-end crosstalk.

* * * * *